United States Patent [19]
Kosinski

[11] Patent Number: 4,951,007
[45] Date of Patent: Aug. 21, 1990

[54] TEMPERATURE COMPENSATED CRYSTAL OSCILLATOR (TCXO) WITH IMPROVED TEMPERATURE COMPENSATION

[75] Inventor: John A. Kosinski, Wall Township, Monmouth County, N.J.

[73] Assignee: The United States of America as represented by the Secretary of the Army, Washington, D.C.

[21] Appl. No.: 417,132

[22] Filed: Oct. 4, 1989

[51] Int. Cl.$^5$ .......................... H03B 5/32; H03L 1/04
[52] U.S. Cl. ..................................... 331/158; 331/176
[58] Field of Search .............................. 331/158, 176

[56] References Cited

U.S. PATENT DOCUMENTS

3,995,233  11/1976  Waker ............................. 331/176 X
4,297,655  10/1981  Fujii et al. ...................... 331/176 X Primary Examiner—Siegfried H. Grimm
Attorney, Agent, or Firm—Michael Zelenka; Roy E. Gordon

[57] ABSTRACT

A TCXO including a series capacitance is improved by having the temperature sensitivity of the series load capacitance be chosen in accordance with the formula $$T_{CL} = T_{C_0} + 2 T_K/(1-\alpha_o)$$

wherein $T_{CL}$ is the temperature coefficient of the series load capacitor, $T_{C_0}$ is the temperature coefficient of the resonator static capacitance, $T_K$ is the temperature coefficient of the piezoelectric coupling for the resonator, and $\alpha_o$ is the center value of load factor $\alpha$ and wherein the load factor, $\alpha$, is defined as $$\alpha = \frac{C_o}{C_o + C_L}$$

wherein $C_o$ is the resonator static capacitance and $C_L$ is the series load capacitance.

6 Claims, 1 Drawing Sheet

TEMPERATURE COMPENSATED CRYSTAL OSCILLATOR (TCXO) WITH IMPROVED TEMPERATURE COMPENSATION

The invention described herein may be manufactured, used, and licensed by or for the Government for governmental purposes without the payment to me of any royalty thereon.

This invention relates in general to a TCXO and in particular to a TCXO with improved temperature compensation.

BACKGROUND OF THE INVENTION

It is known that the resonance frequency of a piezoelectric resonator can be shifted by the addition of a load capacitor in series with the resonator. It is also known that the frequency of a piezoelectric resonator will vary with temperature. The frequency excursion as a function of temperature depends on both the material properties of the resonator and the value of the load capacitor placed in series with the resonator. This dependence has been described in the paper "Frequency-Temperature-Load Capacitance Behavior of Resonators for TCXO Application" by Arthur Ballato as published in the IEEE Transactions On Sonics and Ultrasonics, Vol. SU-25, No. 4, July 1978.

Numerous schemes have been devised in the past to compensate for the temperature sensitivity of the resonator. These have generally involved measuring the temperature excursion of the resonator at a fixed value of load capacitance, and the synthesizing of a circuit wherein the value of load capacitance is varied in such a manner as to compensate for the temperature induced frequency excursion in the resonator. These schemes, although capable of producing oscillators with ±1 part per million frequency stability over operating temperature range when new, are typically found lacking after a period of time has elapsed and trim adjustments have been made to compensate for aging. This is because the trim adjustments to compensate for aging are accomplished by changing the value of series load capacitance by an additional fixed amount independent of temperature, which has both the desired effect of adjusting the frequency at the temperature at which the adjustment is made and the undesired effect of changing the frequency-temperature behavior of the resonator. Since a TCXO is designed to compensate for the frequency temperature behavior at a chosen value of load capacitance, the compensation is degraded when the load capacitance is adjusted to a different value.

SUMMARY OF THE INVENTION

The general object of this invention is to provide a TCXO with improved temperature compensation. A further object is to provide such a TCXO that is degraded less by trim adjustments to correct for aging.

The foregoing objects have now been attained by using a TCXO having a series load capacitor whose temperature coefficient is determined in accordance with the formula $$T_{CL} = T_{C_o} + 2T_K/(1-a_o) \quad \text{(I)}$$

wherein $T_{CL}$ is the temperature coefficient of the series load capacitor, $T_{C_o}$ is the temperature coefficient of the resonator static capacitance, $T_K$ is the temperature coefficient of the piezoelectric coupling for the resonator, and $a_o$ is the center value of load factor $a$. The load factor, $a$, is defined as $$a = \frac{C_o}{C_o + C_L} \quad \text{(II)}$$

where $C_o$ is the resonator static capacitance and $C_L$ is the series load capacitance.

DESCRIPTION OF THE DRAWING

The invention can be best understood by referring to FIG. 1 of the drawing wherein there is shown a generalized schematic of an analog TCXO as is known in the art.

Referring to the drawing, a crystal resonator, 1, is electrically connected to oscillator circuit, 2, to form a closed loop. A variable capacitance, 3, typically embodied as a varactor diode is introduced into the loop to provide a means of frequency adjustment. Resistors, 4, are connected to the terminals of the variable capacitance, 3, to provide a path for DC voltage to be applied to the variable capacitance, 3. Blocking capacitor, 5, is inserted into the closed loop in order to isolate the oscillator circuit, 2, from the DC voltage. The combination of variable capacitance, 3, and blocking capacitor, 5, is also known as the series load capacitance. A regulated DC voltage, 6, is applied to a thermistor network, 7, and the output of the thermistor network, 7, is applied to the open terminals of the resistors, 4.

Figure 1:
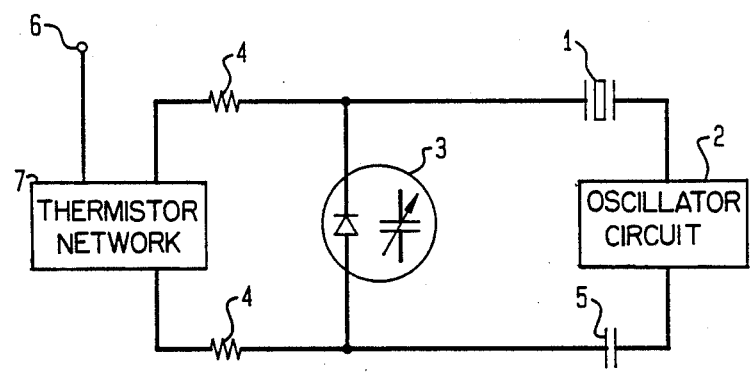

The thermistor network, 7, is designed so as to produce a temperature varying voltage, which in combination with variable capacitance, 3, compensates for the resonator frequency temperature behavior at the nominal center value of load capacitance. Such a technique is known in the art. It suffers, however from the drawback in not being able to compensate for load capacitance induced changes in the resonator frequency-temperature behavior. To wit, by varying the variable capacitance, 3, in order to compensate for the resonator frequency temperature behavior, one changes the frequency temperature behavior that one is trying to compensate.

Applicant's invention lies in overcoming this drawback. In contrast to the current state of the art wherein variable capacitance, 3, and blocking capacitor, 5, are chosen to be temperature invariant components, applicants invention includes choosing the variable capacitance, 3, and blocking capacitor, 5, such that these items are not only temperature sensitive, but their net temperature sensitivity is determined by the teaching of formula (I). When the components are so chosen, the load capacitance induced changes in resonator frequency temperature behavior are compensated by the net temperature behavior of the variable capacitance 3, and blocking capacitor, 5. Implementation of this invention improves the temperature performance of a TCXO by at least one order of magnitude.

In the foregoing schematic, in lieu of the thermistor network, 7, a digital circuit may be employed to produce the temperature varying voltage, in which case, the TCXO is known as a digital TCXO. The substitution does not affect the invention.

In addition, any piezoelectric material can be used in forming the resonator. Such materials include quartz, aluminum phosphate, lithium niobate, lithium tetraborate, etc. For these materials, any cut may be used, although as a rule, one would use a low temperature coefficient of frequency cut. For quartz, such cuts include the AT, SC, BT, and SK cuts. For lithium tetraborate, such cuts include the orientation $\phi=19°$ $\theta=56°$ with thickness excitation of the fundamental harmonic of the slow shear mode, as well as the orientation $\phi=40°$ $\theta=33°$ with thickness excitation of the fundamental harmonic of the extensional mode. Since the piezoelectric coupling and resulting load capacitance induced changes in resonator frequency temperature behavior are 5 to 10 times as large using lithium tetraborate as compared to using quartz, the desirability of employing this invention when using lithium tetraborate is apparent.

DESCRIPTION OF THE PREFERRED EMBODIMENT

A TCXO is desired for use in a mobile communication system. Such a TCXO employs an AT-cut quartz resonator operating at 20 megahertz on its fundamental mode. Such a resonator has a first order temperature coefficient of frequency of $-0.386$ ppm/°K For such an AT cut, $T_K = +100$ ppm/°K and $T_{C_O} = +30$ ppm/°K. Such a resonator is operated with $C_L = 20$ pF, has $C_o = 3$pF, and $\alpha_o$ is therefore 0.130. Substituting these values into equation (I), the required $T_{CL}$ is $+169$ ppm/°K. Therefore, the circuit elements chosen to implement the series load capacitance $C_L$ are chosen such that the first order temperature coefficient of the series load capacitance $T_{CL}$ is $+169$ ppm/°K.

The choice of the series load capacitance circuit elements required to implement the preferred embodiment will be obvious to one skilled in the art.

If the series load capacitance is varied by $\pm 0.5$ pF to compensate for frequency drift due to aging, the first order temperature coefficient of frequency is changed by only 0.16 ppb/°K, which change is 300 times smaller than the change which would occur if formula (I) is not used.

I wish it to be understood that I do not desire to be limited to the exact details of construction shown and described for obvious modifications will occur to a person skilled in the art.

What is claimed is:

1. In a temperature compensated crystal oscillator (TCXO) having a series load capacitance that is temperature sensitive and in which said TCXO includes a crystal resonator electrically connected to an oscillator circuit to form a closed loop, a variable capacitance introduced into the loop to provide a means of frequency adjustment, resistors connected to the terminals of the variable capacitance to provide a path for DC voltage to be applied to the variable capacitance, a blocking capacitor inserted into the closed loop in order to isolate the oscillator circuit from the DC voltage and in which a DC voltage is applied to a thermistor network and the output voltage of the thermistor network applied to the open terminals of the resistors, the improvement wherein the temperature sensitivity of the series load capacitance is chosen in accordance with the formula $$T_{C_L} = T_{C_o} + 2T_K/(1-\alpha_o)$$

wherein $T_{CL}$ is the temperature coefficient of the series load capacitance, $T_{C_o}$ is the temperature coefficient of the resonator static capacitance, $T_K$ is the temperature coefficient of the piezoelectric coupling for the resonator, and $\alpha_o$ is the center value of load factor $\alpha$ and wherein the load factor, $\alpha$, is defined as $$\alpha = \frac{C_o}{C_o + C_L}$$

wherein $C_o$ is the resonator static capacitance and $C_L$ is the series load capacitance.

2. An improved TCXO according to claim 1 wherein the crystal resonator used is an AT-cut quartz resonator.

3. An improved TCXO according to claim 1 wherein the crystal resonator used is an SC-cut quartz resonator.

4. An improved TCXO according to claim 1 wherein the crystal resonator used is a BT-cut quartz resonator.

5. An improved TCXO according to claim 1 wherein the crystal resonator used is an SK-cut quartz resonator.

6. An improved TCXO according to claim 1 wherein the crystal resonator used is a lithium tetraborate resonator.

* * * * *